United States Patent
Maynard et al.

(10) Patent No.: US 8,124,487 B2
(45) Date of Patent: *Feb. 28, 2012

(54) METHOD FOR ENHANCING TENSILE STRESS AND SOURCE/DRAIN ACTIVATION USING SI:C

(75) Inventors: Helen L. Maynard, North Reading, MA (US); Vikram Singh, North Andover, MA (US); Hans-Joachim L. Gossman, Summit, NJ (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 135 days.

This patent is subject to a terminal disclaimer.

(21) Appl. No.: 12/341,489

(22) Filed: Dec. 22, 2008

(65) Prior Publication Data

US 2010/0155898 A1 Jun. 24, 2010

(51) Int. Cl.
*H01L 21/336* (2006.01)
(52) U.S. Cl. .................................. 438/300; 257/E21.43
(58) Field of Classification Search .......... 438/197–200, 438/300–303, 311, 510, 513, 786; 257/E21.17, 257/E21.051, E21.32, E21.267, E21.277, 257/E21.311, E21.421, E21.43, E21.431
See application file for complete search history.

(56) References Cited

U.S. PATENT DOCUMENTS

| | | | |
|---|---|---|---|
| 5,212,101 A | 5/1993 | Canham et al. | |
| 6,608,316 B1 | 8/2003 | Harrison | |
| 7,265,425 B2 | 9/2007 | Chen et al. | |
| 7,282,415 B2 | 10/2007 | Zhang et al. | |
| 7,341,902 B2* | 3/2008 | Anderson et al. | 438/197 |
| 7,364,957 B2 | 4/2008 | Thei et al. | |
| 7,453,113 B2 | 11/2008 | Ouyang et al. | |
| 2007/0105294 A1* | 5/2007 | Chakravarthi et al. | 438/197 |
| 2007/0278427 A1 | 12/2007 | Huang et al. | |
| 2008/0191243 A1 | 8/2008 | Liu et al. | |
| 2008/0203449 A1 | 8/2008 | Zhang et al. | |

* cited by examiner

*Primary Examiner* — Brook Kebede (57) ABSTRACT

A method is disclosed for enhancing tensile stress in the channel region of a semiconductor structure. The method includes performing a series of ion implantation steps at predetermined implant energies to implant carbon ions deep within the semiconductor structure to create a strain layer. The strain layer is annealed using a millisecond anneal process. Subsequent ion implantation steps are used to dope the source/drain region, and the source/drain extension with phosphorus ions, so that the doped regions remain above the strain layer. A second millisecond anneal step activates the source/drain region and the source/drain extension. The strain layer enhances carrier mobility within a channel region of the semiconductor structure, while also preventing diffusion of P within the structure.

22 Claims, 7 Drawing Sheets

METHOD FOR ENHANCING TENSILE STRESS AND SOURCE/DRAIN ACTIVATION USING SI:C

BACKGROUND OF THE INVENTION

1. Field of the Invention

Embodiments of the invention relate to the field of stress enhancements in the source/drain regions of transistors. More particularly, the present invention relates to a method for enhancing stress and source/drain activation using carbon ion implantation.

2. Discussion of Related Art

Current flowing through an electric field in the channel region of a field effect transistor is proportional to the mobility of the carriers (e.g., electrons in n-type field effect transistors (n-FETs) and holes in p-type field effect transistors (p-FETs)) in the channel region. Different strains on the channel region can effect carrier mobility and, thus, current flow. For example, compressive stress on a channel region of a p-FET can enhance hole mobility. Tensile stress on a channel region of an n-FET can enhance electron mobility. A number of stress engineering techniques are known for imparting the desired stress on n-FET and p-FET channel regions. For example, a compressive stress (i.e., a uni-axial compressive strain parallel to the direction of the current) can be created in the channel region of a p-FET by forming the source/drain regions with an alloy of silicon (Si) and germanium (Ge). A tensile stress (i.e., a uni-axial tensile strain parallel to the direction of the current) may be created in the channel region of an n-FET by forming the source/drain regions with an alloy of Si and carbon (C).

One problem with doping the source/drain region with an alloy containing C, however, is that the dopant ions (often arsenic (As) or phosphorus (P)) compete with the C ions for substitutional sites on the Si lattice, thus reducing the overall effectiveness of the dopant, and resulting in an increase in the sheet resistance ($R_s$) of the region, which undesirably reduces conductivity in the channel region.

Thus, there is a need for a method for creating strained Si:C layers that retain good conductivity (i.e. have desirably low sheet resistance) in the source/drain region, while also providing a desired tensile stress to enhance conductivity in the channel regions of semiconductor devices.

SUMMARY OF THE INVENTION

A method for enhancing stress in a source or drain region of a semiconductor device is disclosed. The method may comprise: providing a semiconductor structure comprising a silicon substrate having a channel region, source/drain regions and a gate region overlying the channel region; forming a strain layer within the semiconductor structure, the strain layer located a first distance below an upper surface of the semiconductor structure, the strain layer comprising C ions; annealing the semiconductor structure to produce a strain in the strain layer; forming a doped region within the semiconductor structure, the doped region located a second distance below the upper surface of the semiconductor structure, the second distance being smaller than the first distance; and annealing the semiconductor structure to activate the doped region.

An integrated circuit is also disclosed, comprising a silicon substrate, a strain layer within the silicon substrate, the strain layer located a first distance below an upper surface of the silicon substrate, the strain layer comprising C ions; and a doped layer within the silicon substrate. The doped layer may be located a second distance below the upper surface of the semiconductor structure, the second distance being smaller than the first distance. The strain layer may comprise a plurality of overlapping sub-layers, at least first and second of said overlapping sub-layers overlap with each other at about a 50% concentration point of the second overlapping sub-layer.

A method for enhancing stress in a source or drain region of a semiconductor device is further disclosed. The method may comprise: providing a semiconductor structure; forming a strain layer within the semiconductor structure using a plurality of ion implantation steps using a C ion source, the strain layer located a first distance below an upper surface of the semiconductor structure; annealing the semiconductor structure using a millisecond annealing technique to produce a strain in the strain layer; forming a doped region within the semiconductor structure, the doped region located a second distance below the upper surface of the semiconductor structure, the second distance being smaller than the first distance; and annealing the semiconductor structure using a millisecond annealing technique to activate the doped region.

BRIEF DESCRIPTION OF THE DRAWINGS

The accompanying drawings illustrate preferred embodiments of the disclosed method so far devised for the practical application of the principles thereof, and in which.

DESCRIPTION OF EMBODIMENTS

Optimal transistor performance relies on low source/drain (S/D) resistance. A technique is thus disclosed for creating a Si:C alloy material using ion implantation and thermal processing that exploits the beneficial aspects of C (i.e., highly effective strain induction), while minimizing the undesirable effects on channel region sheet resistance caused by C implantation. The disclosed technique implants C ions at a lower level in the S/D structure than the dopant ions (e.g., P, As), thus creating a conductive (doped) S/D layer on top of the C-containing strain layer.

As will be understood, ion implantation refers generally to the process of depositing chemical species into a substrate by direct bombardment of the substrate with energized ions. In semiconductor manufacturing, ion implanters are often used for doping processes that alter the type and level of conductivity of target materials. A precise doping profile in an integrated circuit substrate and its thin-film structure may be used to achieve proper device performance. To obtain a desired doping profile, one or more ion species may be implanted in different doses and at different energy levels. In the disclosed method, ion implantation is used to create a structure in which separation of C ions from dopant ions is maximized. This arrangement enhances conductivity in the S/D region by keeping the C ions out of the dopant layer, and it maximizes channel strain by keeping the dopant ions out of the C layer.

Separately creating the strain and dopant layers may also make it possible to optimize the processing of each layer, including lateral placement of ions (i.e., the S/D region, or the S/D extension (SDE) region), and thermal processing (i.e., annealing).

In one embodiment, the implant of C ions may be oriented along the Si material's crystallographic planes to further minimize the amount of C resulting in the dopant layer. With the known crystalline lattice structure of Si, the Si wafer may be oriented to allow the implanted ions to travel through the Si along desirable paths (i.e., those in which the ions will interact with fewer Si atoms), so that the ions can be implanted farther down into the structure. In the case of C implantation, the C can be driven down farther into the Si, avoiding the surface region in which the P or As dopant ions will be later be implanted, thus resulting in further separation of the dopant and strain layers.

A method is thus disclosed to optimize transistor structure using Si:C implantation. In one exemplary embodiment, before the usual source/drain extension (SDE) implant is performed, C ions are implanted deep in the Si structure (i.e., at a depth at which the strain layer is desired). The structure is then annealed with a recipe optimized to produce strain in the C-containing strain layer (i.e., one that forces the C ions onto the Si-lattice sites). The annealing process can include a millisecond anneal to very quickly raise the temperature of the structure to about 1300° C., which may cause the implanted C ions to "jump" onto the Si lattice sites. Millisecond annealing may comprise a laser annealing process or a flash annealing process. If a laser anneal is used, it can be either a full melt anneal or sub-melt anneal, as long as it achieves the desired level of strain. Once the strain layer is annealed, the SDE may then implanted, followed by extension spacer formation. The S/D region may then implanted and annealed to activate the S/D region and the SDE. Optionally, it may be possible to use a single anneal step. In such a case the stressor may be implanted followed by the dopant implant. A single anneal is then performed to simultaneously create strain and activate the dopant.

Figure 1:
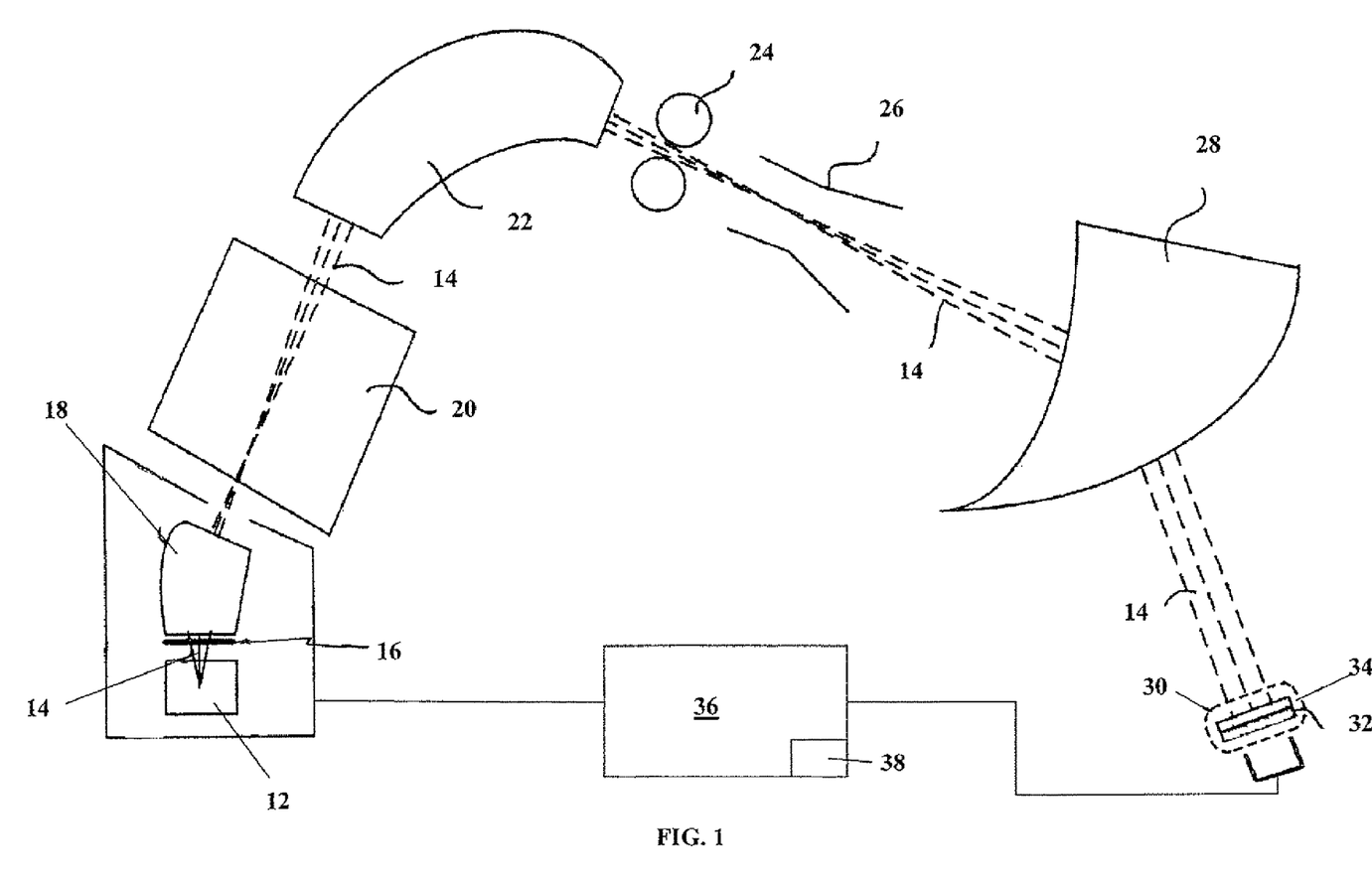
FIG. 1 is a schematic diagram of an exemplary ion implanter system.

An exemplary ion implanter system 10 is illustrated in FIG. 1. At the outset it will be appreciated that system 10 is but one of a variety of ion implanter systems that may be used to implement the disclosed method, and that the disclosed method is not in any way limited in its application to the specifics of the illustrated system. Thus, any type of ion implanter or plasma-based may be used, as long as it is capable of implanting greater than $1\times10^{15}$ doses (ions/cm$^2$), and energies between 200 and 20,000 eV. Further, the system may or may not include mass filtering.

The illustrated ion implanter system 10 may comprise an ion source 12 and a series of components through which an ion beam 14 passes. This series of components may include an extraction manipulator 16, a filter magnet 18, an acceleration or deceleration column 20, an analyzer magnet 22, a rotating mass slit 24, a scanner 26, and a corrector magnet 28. The ion implanter components filter and focus the ion beam 14 before steering it towards an end station 30.

The end station 30 may have a platen 32 for supporting a workpiece 34, such as a Si wafer, in the path of ion beam 14 so that ions of the desired species are implanted into the workpiece 32. In some embodiments, the ion implanter system 10 may include a system controller 36 programmed to control the components of the ion implanter system 10. The system controller 36 may be connected to, and in communication with, some or all of the aforementioned system components. For example, the system controller 36 be operable to adjust the energy with which the ions are implanted to obtain a desired depth of implantation. The system controller 36 may include a processor 38 executing instructions for performing one or more steps of the disclosed method.

Figure 2A:
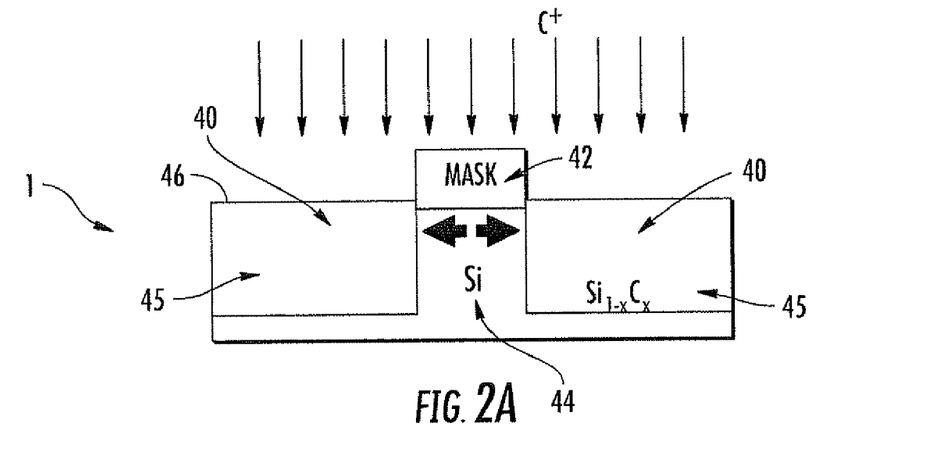
FIG. 2A is a cross-section view of an exemplary transistor structure in which the transistor gate region serves as mask for carbon ion implantation.

Referring now to FIG. 2A, a cross-section of an exemplary semiconductor structure 1 is illustrated having S/D regions 40, a gate region 42 and a channel region 44. FIG. 2A illustrates schematically the ion implantation process in which C ions are implanted deep into the structure. In the illustrated embodiment the gate region 42 serves as a mask during the C implantation process so as to maintain the channel region 44 substantially free of C ions. Although not shown, it will be appreciated that photoresist may be disposed over the gate region 42, and/or over the far left and far right ends of the S/D region 40 to facilitate precise implantation of C ions at desired locations.

C implantation may be performed in one or more implantation steps. Where multiple implantation steps are used, the energy level and/or implantation time may be varied between the different steps to achieve a desired final implant profile in the semiconductor structure. In addition, one or more of the implant steps may be oriented along the Si material's crystallographic planes to facilitate deep implantation as previously discussed.

Once the C implantation process is complete, the semiconductor structure 1 may be annealed to create a strained region 45 that is spaced a predetermined distance "D" from the upper surface 46 of the semiconductor structure 1. One or more of these annealing steps can be millisecond anneal steps, which may comprise laser annealing and/or flash annealing. The annealing steps may force the implanted species onto lattice sites in the Si material, which thereby induces the desired stress in the layer. Examples of other appropriate anneal types include a solid phase epitaxy anneal, which is often a relatively long, low temperature anneal. The criterion for an acceptable anneal process is that recrystallization should be faster than the average time it takes an atom to diffuse to another implanted ion, forming precipitates. This is a function of the implanted dose, temperature, time and diffusivities of the ions in the amorphous and crystalline material.

It will be appreciated that the C-implantation steps should be performed in a manner that results in strained regions 45 being closely adjacent to channel region 44 so as to maximize strain on the channel carriers. Maximizing strain on the channel carries results in enhanced electron mobility in the channel region, thus enhancing conductivity.

Figure 2B:
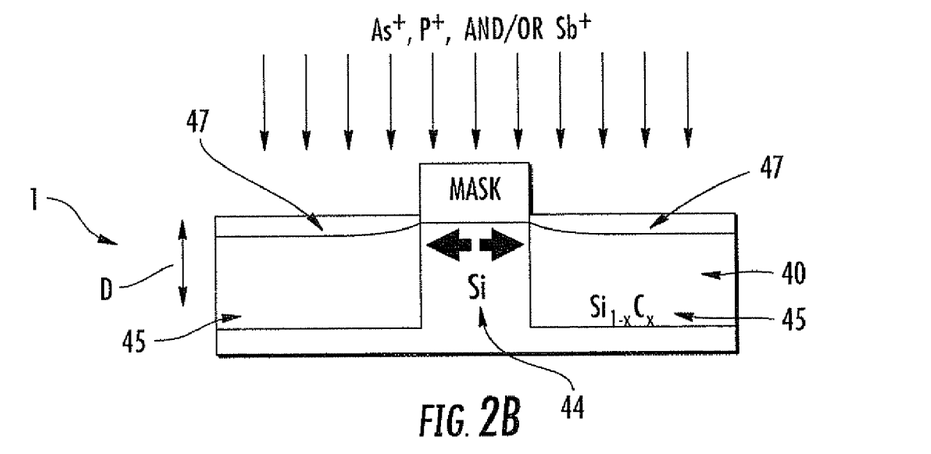
FIG. 2B is a cross-section view of the structure of FIG. 2A in which a source/drain extension dopant is implanted.

Referring to FIG. 2B, source/drain extensions (SDEs) 47 are formed via an ion implantation step that implants one or more dopant material(s) into the S/D regions 40 on either side of the gate region 42, and above the strained regions 45. Examples of such dopants include As, P and Antimony (Sb). During this implantation process, the channel region 44 is again masked by the gate region 42 to minimize the presence of dopant ions in the channel region 44.

Figure 2C:
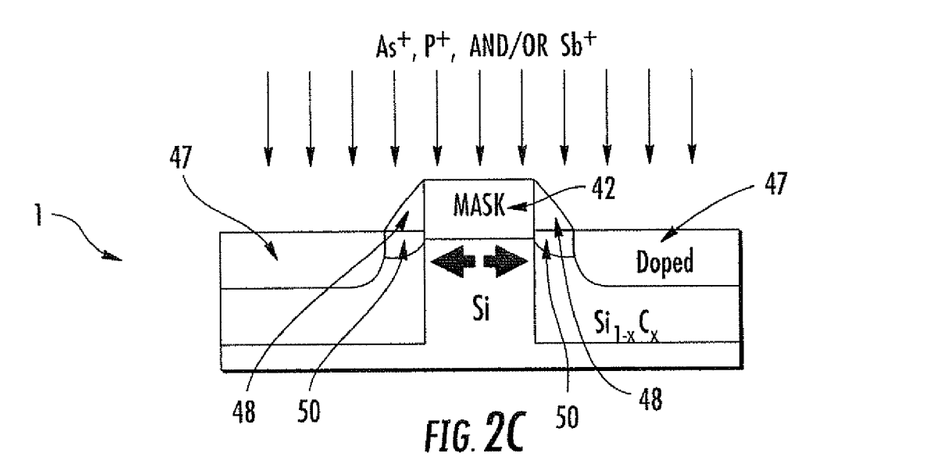
FIG. 2C is a cross-section view of the structure of FIGS. 2A and 2B in which a source/drain extension spacer is formed which is then used as a mask for the source/drain regions during dopant implantation.

In FIG. 2C, SDE spacers 48 are formed on either side of the gate region 42 to mask off the S/D regions for further implantation of dopant. The dopant used for the SDE spacers may be the same or different from the dopant used in the S/D regions 40. In one exemplary embodiment, arsenic (As) may be used as the dopant near the channel region, since it has less of a propensity to diffuse as compared to P. P may be used in the S/D regions 40 as it has a higher solid solubility than As. After implantation, the S/D regions 50 underlying the spacers 48, and the SDE regions 47, are activated using one or more annealing steps. One or more of these annealing steps can be millisecond anneal steps, including laser annealing or flash annealing, solid-phase epitaxy and/or RTP spike anneals.

Figure 3:
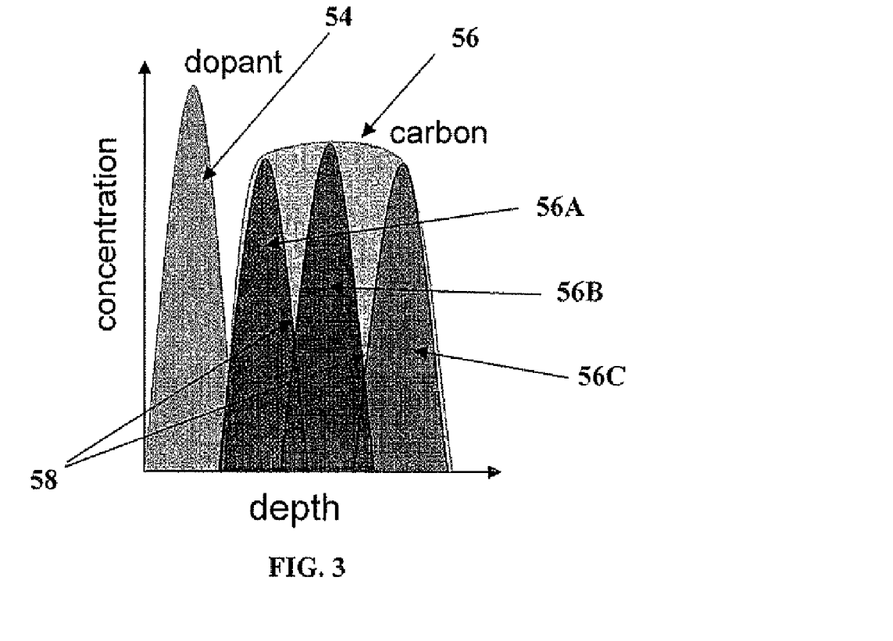
FIG. 3 is a graphical representation of implanted Carbon ion concentration profiles as a function of depth for the dopant and strain layers.

Referring now to FIG. 3, exemplary resultant concentration profiles are shown as a function of depth for dopant and strain (C-containing) layers 54, 56, respectively. In this embodiment the strain layer 56 is formed by multiple C-ion implantation procedures which result in the three different C-implant profiles 56A-C shown in the Figure. Each of the C-ion implantation procedures is performed at a specific implant energy to achieve a desired implantation depth. The implant energies of the multiple C-ion implantation procedures may all be the same, or they may be different from each other. The exact thicknesses of each layer 54, 56 will depend on the particular transistor design in which the layers will be incorporated, and will include considerations such as how large the S/D region is, whether the transistor will be high speed/low power, and the like. For example, in sub-90 nanometer (nm) node transistors, the dopant layer 54 may be from about 500 Angstroms (Å) to about 750 Å below the surface 46 of the structure 1, while the strain layer 56 may be about 2500 Å below the surface 46. It will be appreciated that these layer depths and thicknesses are merely exemplary, and will be different for cases in which the disclosed procedure is used in applications such as power transistor applications, solar cell applications, periphery circuit applications on CMOS detectors, and the like.

As can be seen in FIG. 3, the strain layer 56 may have a box-like profile which, as previously noted, can be produced by a series of individual C-ion implants 56A-C achieved at various depths below the surface 46 of the structure 1. As previously noted, these varying C-implant depths can be obtained by performing the implants at different energy levels, and/or by orienting the implants along the crystallographic planes of the structure substrate. The goal is to make the maximum concentration of C-ions uniform across the depth of the strain layer 56 so as to maximize total strain. Since deeper implants will tend to spread out more than shallower implants (due to the higher energies applied and the greater number of interactions with the atoms of the substrate), more ions must be implanted during the deepest implant steps. In one embodiment, an overlap of successive C implants is achieved so that successive implants overlap at about the 50% concentration mark of the lower-energy implant (see overlap points 58). In this way, when the individual implants 56A-C are "added together" the resulting strain layer 56 will be relatively flat.

The dopant layer 54 is shown in FIG. 3 as being at the surface. In one embodiment the dopant layer 54 will have as little overlap with the strain layer 56 as possible. Further, the strain layer 56 should be positioned as close to the channel region 44 (FIGS. 2A-C) as possible to maximize strain on the channel carriers as previously described. Optimization of the exact overlap between the dopant and strain layers 54, 56 will depend on engineering tradeoffs for a particular transistor design. Thus, if it is desired to obtain maximum strain on the channel carriers, then more overlap between layers 54, 56 may be obtained. If, however, it is desired to optimize sheet resistance in the conductive regions of the device, then less overlap between layers 54, 56 may be obtained. As will be appreciated, the amount of overlap is controllable by controlling the energy of the individual implants.

The depth and abruptness (i.e., the rate at which the dopant ion concentration decreases as a function of depth) of the dopant layer 54 may be determined by a variety of factors, including the desired short channel behavior, leakage, and series resistance of the resulting device. Typically it is desired to maintain the dopant layer 54 relatively shallow so that the transistor turns off well and current in the off-state is minimized. For sub-90 nm devices, the dopant layer 54 may be about 750 Å thick.

In addition to inducing strain in strain layer 56, C-ions may provide an additional benefit in that they can act as a diffusion barrier to phosphorus (P) when P is used as the dopant in dopant layer 54. P has desirable properties as a dopant (e.g., low sheet resistance $R_s$), but it also has a propensity to diffuse throughout the materials in which it is implanted. It is desirable to minimize dopant diffusion in order to minimize negative effects such as short-channel effects and leakage. As a result, arsenic (As) has often been used as a dopant in lieu of P because As does not have the same tendency to diffuse. Using C in the strain layer 56, however, enables the use of P in the dopant layer 54 without the aforementioned diffusion. Since lower sheet resistances can be achieved with P than with As, P is more desirable for use in the dopant layer 54. The inventors have found that even a relatively modest amount of C beneath the dopant layer prevents diffusion, as shown in FIGS. 4A-4C.

Figure 4A:
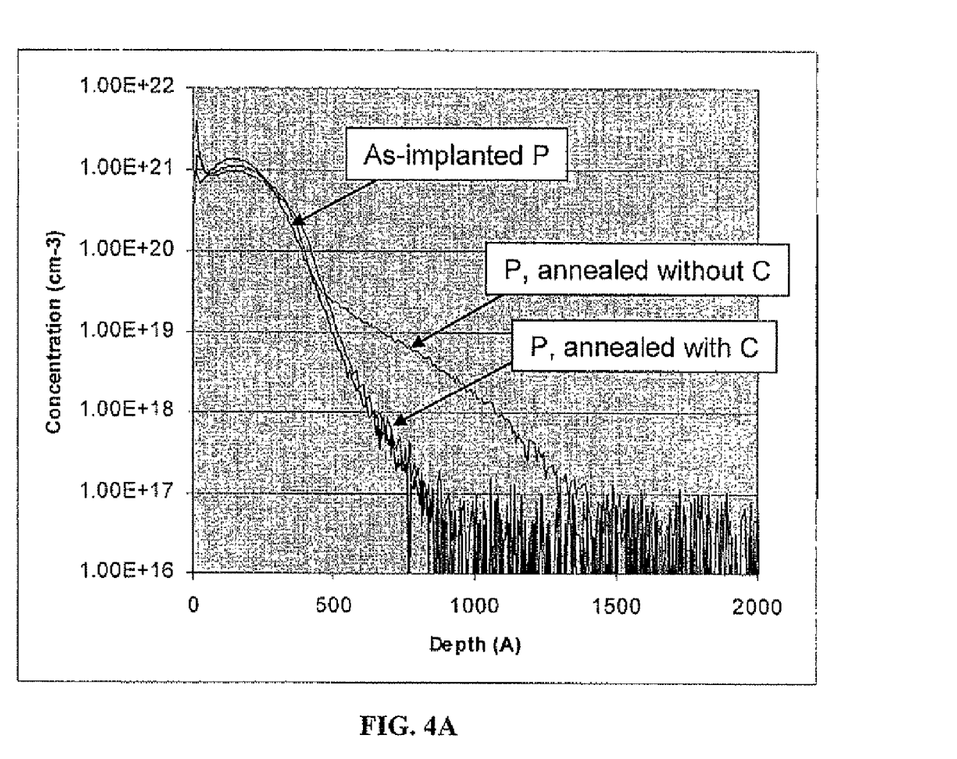
FIG. 4A is an exemplary plot of ion concentration vs. depth of implantation according to an exemplary embodiment of the present invention.

Referring now to FIG. 4A, an exemplary diffusion plot illustrates the effect of C-ion implantation on the diffusion of P. In the illustrated embodiment, a Si wafer was first amorphized with an implant of Si 100 keV, $2.5 \times 10^{15}/cm^2$, $3 \times 10^{15}/cm^2$ of either 20 keV As or 12 keV P, where then implanted to Rp=200 Å. 15 keV C, $6 \times 10^{15}/cm^2$ was then implanted, followed by a 40 second anneal at 850° C.

The results show a comparison of three scenarios. The first scenario is the profile of "as-implanted P", showing the concentration profile, by depth, of P ions upon implantation and prior to annealing. The second scenario is the profile of "P, annealed without C," which shows the substantial diffusion of P when the wafer is subjected to a post-implantation annealing step. The third scenario is the profile of "P, annealed with C," and shows how the presence of implanted C ions retards the diffusion of P, maintaining the concentration profile of P in substantially the same form as the unannealed state.

Figure 4B:
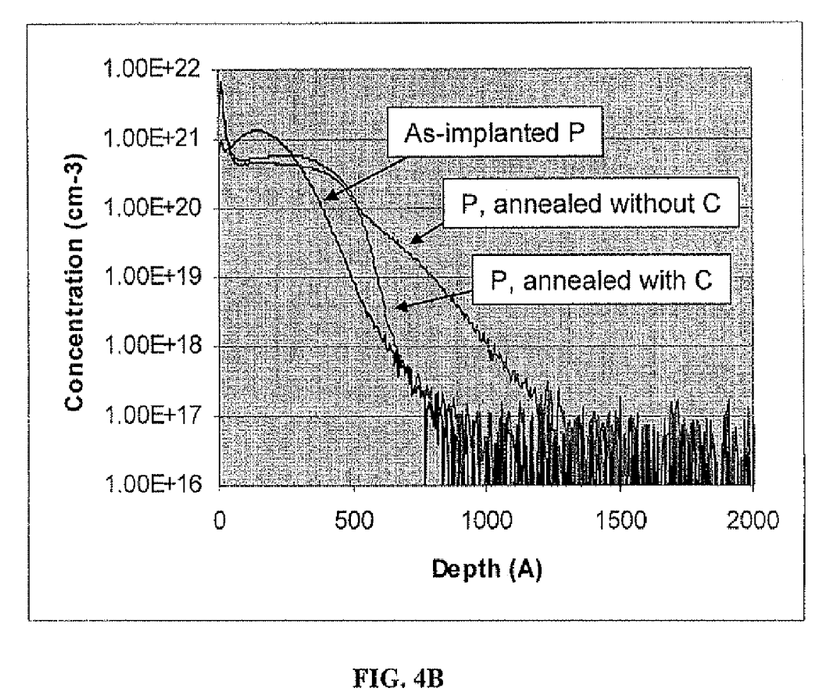
FIG. 4B is an exemplary plot of ion concentration vs. depth of implantation according to an exemplary embodiment of the present invention.

FIG. 4B illustrates another exemplary diffusion plot showing the effect of C-ion implantation on the diffusion of P when the implanted Si wafer is subjected to a high temperature spike anneal. In this embodiment, a Si wafer was again amorphized with an implant of $2.5 \times 10^{15}/cm^2$, 100 keV Si and $3 \times 10^{15}/cm^2$ of either 20 keV As or 12 keV P, where then implanted to $R_p$=200 Å. 15 keV C, $6 \times 10^{15}/cm^2$ was then implanted, followed by a 1065° C. spike anneal.

The results again show a comparison of three scenarios. The first scenario—the profile of "as-implanted P", shows a concentration profile, by depth, of P ions upon implantation and prior to annealing. The second scenario is the profile of "P, annealed without C," which again shows substantial diffusion of P when the wafer is subjected to a post-implantation annealing step. The third scenario—the profile of "P, annealed with C," again shows how the presence of implanted C ions substantially retards the diffusion of P even when subjected to a high temperature annealing step.

Figure 5A:
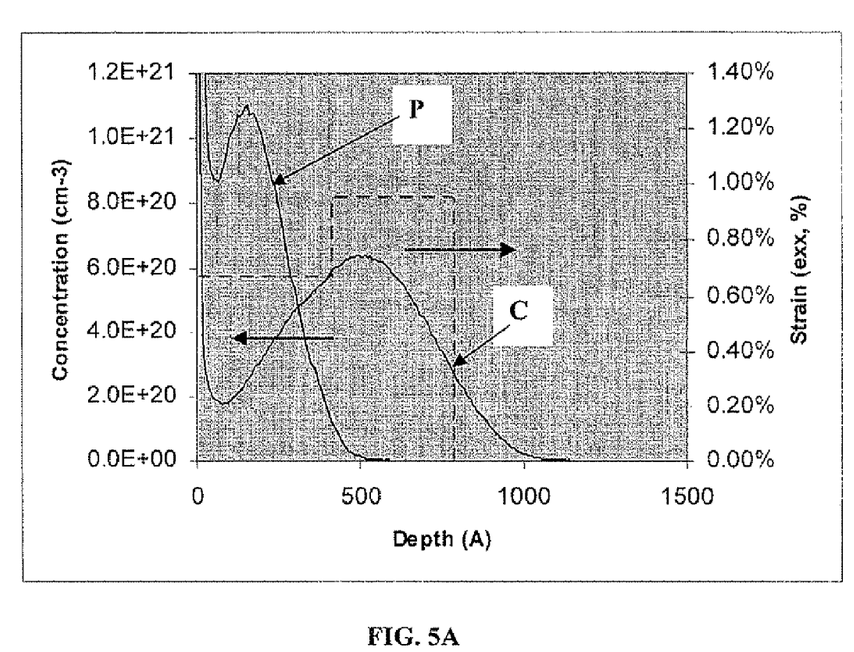
FIG. 5A is an exemplary plot of ion concentration vs. depth of implantation according to an exemplary embodiment of the present invention.

FIG. 5A illustrates an exemplary embodiment in which overlap between the dopant and carbon ion containing layers is minimized. Specifically, secondary ion mass spectrometry (SIMS) profiles of P and C are illustrated. Strain values are shown on right-hand axis, implant depth on the bottom, and implanted ion concentration on the left hand axis. In this embodiment, a Si wafer was amorphized with an implant of Si 100 keV, $2.5 \times 10^{15}/cm^2$, $3.3 \times 10^{15}/cm^2$ of 15 keV C and $3 \times 10^{15}/cm^2$ of 12 keV P were then implanted, followed by a 40 second anneal at 850°.

Figure 5B:
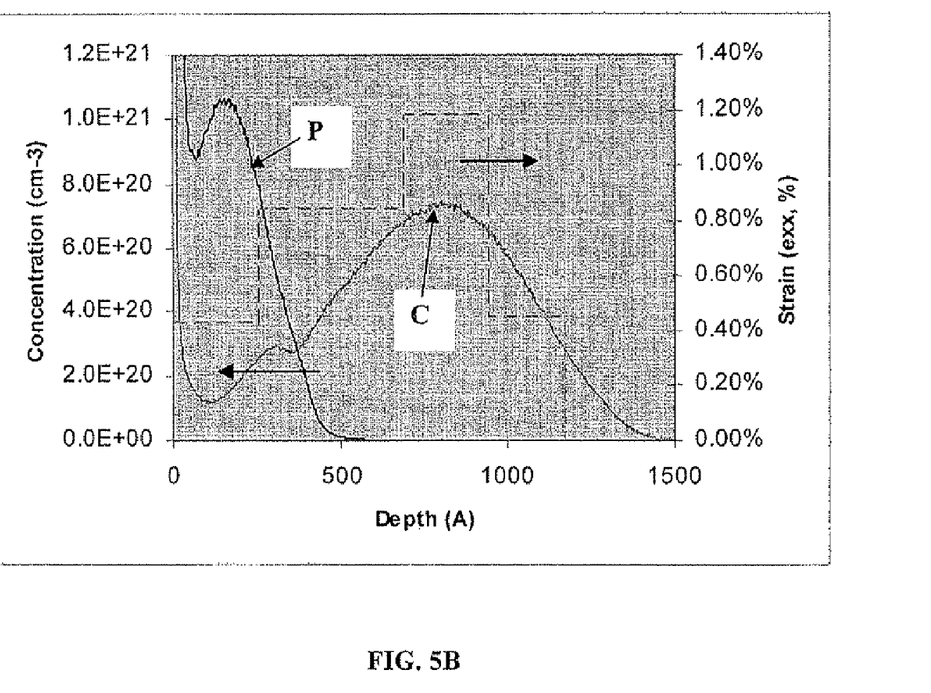
FIG. 5B is an exemplary plot of ion concentration vs. depth of implantation according to an exemplary embodiment of the present invention.

FIG. 5B illustrates another exemplary embodiment in which overlap between the dopant and carbon containing layers is minimized. Again, strain values are shown on right-hand axis, implant depth on the bottom, and implanted ion concentration on the left hand axis. Wafers were amorphized with an implant of Si 100 keV, $2.5 \times 10^{15}/cm^2$. $5 \times 10^{15}/cm^2$ of 25 keV C and $3 \times 10^{15}/cm^2$ of 12 keV P were then implant, followed by a 40 second anneal at 850°. As can be seen by comparing FIGS. 5A and 5B, although the peak concentration of C is approximately equal between the two, the maximum strain produced in the FIG. 5B scenario (1.2%) is considerably larger than that of FIG. 5A due to the reduction in overlap between C and P at the depth of maximum strain (600 Å in FIG. 5A, vs. 800 Å in FIG. 5B).

Figure 6:
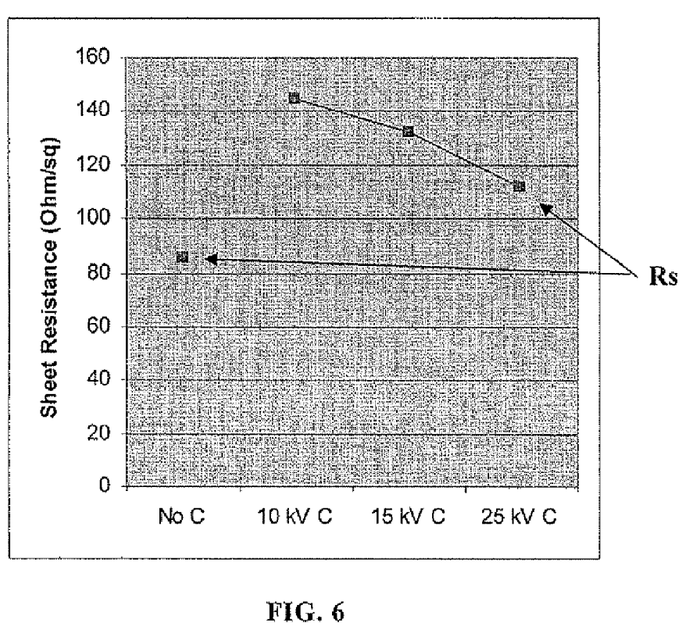
FIG. 6 is an exemplary plot of sheet resistance vs. implant energy according to an exemplary embodiment of the present invention.

FIG. 6 shows how sheet resistance (Rs) in the S/D region changes as C ions are implanted further away from the dopant layer 54. Specifically, it can be seen that $R_s$ (shown on the left axis) decreases as the depth of the C-ion implant (represented on the bottom axis as implantation energy) increases. This further demonstrates how sheet resistance may be improved (i.e., reduced) by separating C from dopant (e.g., P).

Figure 7:
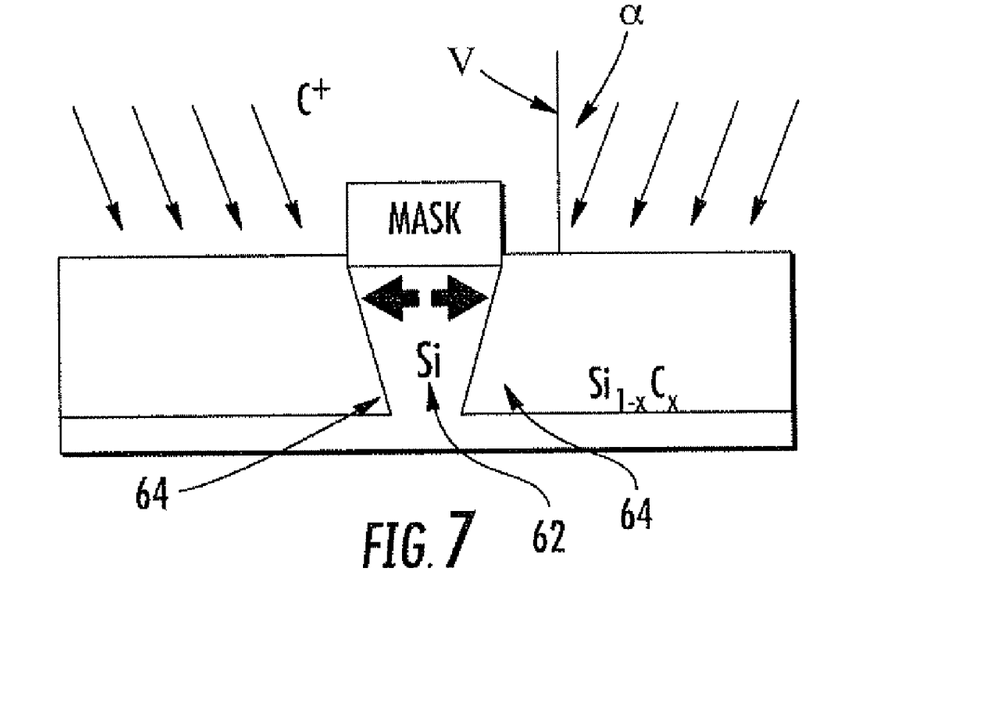
FIG. 7 is a cross-section view of a transistor structure in which a tilted implant is performed around the gate region.

Referring now to FIG. 7, a tilted C-ion implant can be performed around the gate region 60 to further improve strain in the channel region 62. The tilted implant further improves strain in channel region 62 by placing the C-containing strain layer 64 partially beneath the channel region 62, thus creating additional strain in close proximity to the channel region to further enhance carrier mobility in the channel region. This tilted implant can be formed at angles (α) ranging from about 0 degrees to about 60 degrees as measured from the vertical axis "V". In one exemplary embodiment, the angle "α" may be about 30 degrees.

Figure 8:
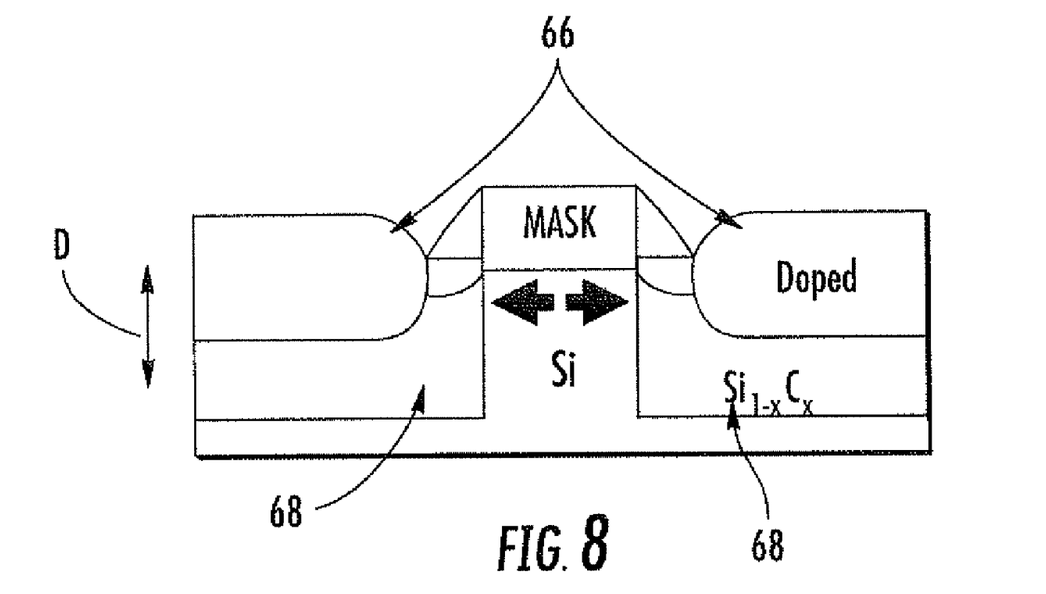
FIG. 8 is a cross-section view of an exemplary transistor structure showing a buried Si:C strain layer incorporated into a structure having raised S/D regions.

The disclosed techniques may also be used with a structure having a elevated S/D regions 66, as depicted in FIG. 8. Elevated S/D regions 64 are advantageous because they provide additional Si above the plane of the gate dielectric that can be consumed during the silicide reaction. The additional Si reduces the overall resistance through the S/D regions. If the implantation of C ions is to be performed after the creation of the elevated S/D regions 64, then the implant voltage is adjusted upward to account for the additional depth that the implanted C ions are required to travel to reach the depth "D" desired for the C-containing strain layer 68. In some embodiments, however, the implantation of C ions may be performed before the elevated S/D regions are formed.

Figure 9:
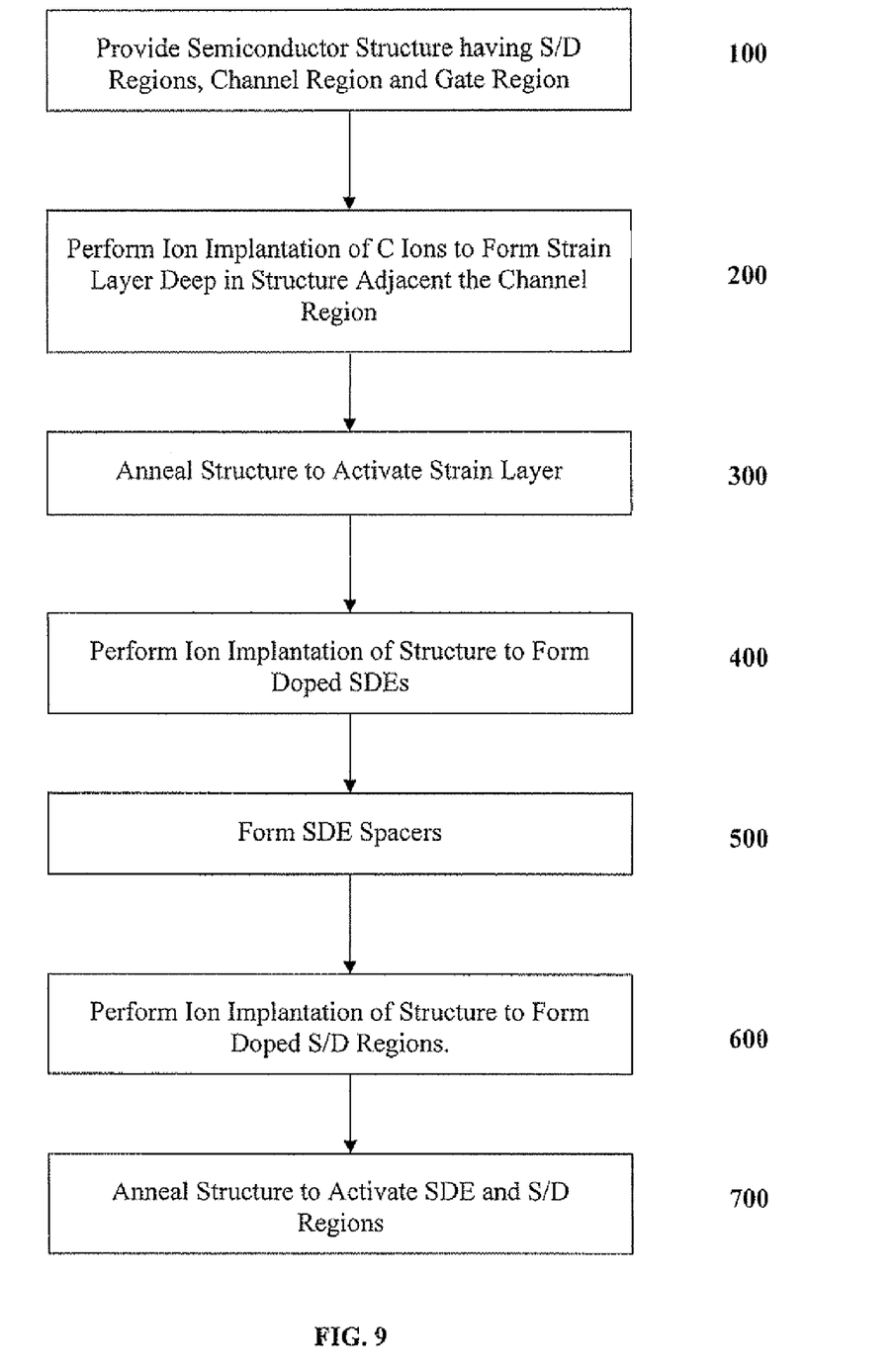
FIG. 9 is a flow chart describing an exemplary process flow for the disclosed method.

An exemplary process flow for the disclosed method will now be described in greater detail with reference to FIG. 9. At step 100, a semiconductor structure 1 is provided having a source and drain regions 40, a channel region 44 and a gate region 42 overlying the channel region. At step 200, C ions are implanted into the structure 1 using an implantation energy sufficient to place the C ions relatively deep within the semiconductor structure 1, adjacent to the channel region 44. During this step, the gate region 42 may serve as a mask to prevent implantation of C ions in the channel region 44. The implantation of C ions may occur in multiple individual implantation steps such that a desired quantity of C ions are implanted at predetermined depths in the structure 1.

At step 300 the C-implanted structure 1 is annealed to cause the implanted C ions to take positions on the Si lattice, and also to stay on the lattice rather than precipitating, thus creating a strain layer 45 in the structure 1. Step 300 may include a single annealing step, or it may comprise multiple annealing steps, and the annealing step(s) can be a spike anneal, a laser anneal, or other appropriate annealing technique.

At step 400, the semiconductor structure 1 may be subjected to an ion implantation process that implants dopant ions (e.g., As, P, Sb) into the semiconductor structure 1 above the level of the strain layer 45. This implantation process may create SDE regions 47 on either side of the gate region 42. The channel region 44 is again masked by the gate region 42 to minimize implantation of dopant ions in the channel region 44. At step 500, SDE spacers 48 may be formed on either side of the gate region 42 to mask the S/D regions, followed by an additional dopant implantation at step 600.

In one alternative embodiment, the C-ion implantation step may be performed after the SDE spacers have been formed. In a further alternative embodiment, some C ions may be implanted before the SDE spacers have been formed, and additional C ions may be implanted after the SDE spacers are formed.

At step 700, the S/D regions 50 underlying the spacers 48, as well as the SDE regions 47, may be activated using one or more annealing steps. One or more of these annealing steps can be millisecond anneal steps, which may comprise laser annealing and/or spike annealing.

The method described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art would include such devices as a readable or writeable CD, flash memory chips (e.g., thumb drives), various magnetic storage media, and the like.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

The functions and process steps herein may be performed automatically or wholly or partially in response to user command. An activity (including a step) performed automatically is performed in response to executable instruction or device operation without user direct initiation of the activity.

The systems and processes of FIGS. 1-9 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The processes and applications may, in alternative embodiments, be located on one or more (e.g., distributed) processing devices accessing a network linking the elements of FIG. 1. Further, any of the functions and steps provided in the Figures may be implemented in hardware, software or a combination of both and may reside on one or more processing devices located at any location of a network linking the elements of FIG. 1 or another linked network, including the Internet.

What is claimed is:

1. A method for enhancing stress in a source or drain region of a semiconductor device, comprising:
   providing a semiconductor structure comprising a silicon substrate having a channel region, source/drain regions and a gate region overlying the channel region;
   forming a strain layer within the semiconductor structure, the strain layer located a first distance below an upper surface of the semiconductor structure, the strain layer comprising C;
   annealing the semiconductor structure to produce a strain in the strain layer;
   forming a doped region within the semiconductor structure, the doped region located a second distance below the upper surface of the semiconductor structure, the second distance being smaller than the first distance; and
   annealing the semiconductor structure to activate the doped region, wherein the step of forming a strain layer comprises multiple ion implantation steps implanting C ions.

2. The method of claim 1, wherein the multiple ion implantation steps form multiple overlapping C-containing layers at different distances below the upper surface of the semiconductor structure.

3. The method of claim 2, wherein said multiple ion implantation steps comprise at least first and second ion implantation steps performed at different implantation energies.

4. The method of claim 2, wherein said multiple ion implantation steps comprise at least first and second ion implantation steps, the first ion implantation step comprising implanting ions oriented along crystallographic planes of the silicon substrate, the first and second ion implantation steps being performed at substantially the same energy, and the first ion implantation step resulting in implantation of C-ions a greater distance from the upper surface of the structure than C-ions implanted during the second ion implantation step.

5. The method of claim 4, wherein the first and second ion implantation steps result in first and second C-ion containing layers that overlap with each other at about a 50% concentration point of the second C-ion containing layer.

6. The method of claim 1, wherein the step of annealing the semiconductor structure to produce a strain in the strain layer comprises a millisecond anneal technique.

7. The method of claim 1, wherein the step of forming a doped region comprises doping a portion of the semiconductor structure with ions comprising at least one of Phosphorus, Arsenic and Antimony.

8. The method of claim 1, wherein the step of forming a strain layer comprises at least one ion implantation step in which the ions impinge the semiconductor structure at an angle less than 90-degrees with respect to the upper surface of the semiconductor structure.

9. The method of claim 1, wherein the step of forming a strain layer comprises at least one ion implantation step in which ions are oriented along crystallographic planes of the silicon substrate to enhance deep placement of C ions in the semiconductor structure.

10. An integrated circuit comprising:
    a silicon substrate,
    a strain layer within the silicon substrate, the strain layer located a first distance below an upper surface of the silicon substrate, the strain layer comprising C ions;
    a doped layer within the silicon substrate, the doped layer located a second distance below the upper surface of the silicon substrate, the second distance being smaller than the first distance;
    wherein the strain layer comprises a plurality of overlapping sub-layers, at least first and second of said overlapping sub-layers overlap with each other at about a 50% concentration point of the second overlapping sub-layer.

11. The integrated circuit of claim 10, wherein one sub-layer of the plurality of sub-layers comprises a C-ion concentration that is substantially different from a C-ion concentration of another sub-layer of said plurality of sub-layers.

12. The integrated circuit of claim 10, wherein the plurality of sub-layers comprise overlapping C-ion containing layers at different distances below the upper surface of the silicon substrate.

13. The integrated circuit of claim 10, wherein the doped region comprises ions of at least one of Phosphorus, Arsenic and Antimony.

14. A method for enhancing stress in a source or drain region of a semiconductor device, comprising:
    providing a semiconductor structure;
    forming a strain layer within the semiconductor structure using a plurality of ion implantation steps using C ions, the strain layer located a first distance below an upper surface of the semiconductor structure;
    annealing the semiconductor structure using a millisecond annealing technique to produce a strain in the strain layer;
    forming a doped region within the semiconductor structure, the doped region located a second distance below the upper surface of the semiconductor structure, the second distance being smaller than the first distance; and
    annealing the semiconductor structure using a millisecond annealing technique to activate the doped region.

15. The method of claim 14, wherein the multiple ion implantation steps form multiple overlapping C-containing layers at different distances below the upper surface of the semiconductor structure.

16. The method of claim 14, wherein said multiple ion implantation steps comprise at least first and second ion implantation steps performed at different implantation energies.

17. The method of claim 14, wherein said multiple ion implantation steps comprise at least first and second ion implantation steps, the first ion implantation step comprising implanting ions oriented along crystallographic planes of the semiconductor structure, the first and second ion implantation steps being performed at substantially the same energy, and the first ion implantation step resulting in implantation of C-ions a greater distance from the upper surface of the structure than C-ions implanted during the second ion implantation step.

18. The method of claim 17, wherein the first and second ion implantation steps result in first and second C-ion containing layers that overlap with each other at about a 50% concentration point of the second C-ion containing layer.

19. The method of claim 14, wherein at least one of the millisecond anneal steps comprises a laser anneal.

20. The method of claim 14, wherein the step of forming a doped region comprises doping a portion of the semiconductor structure with ions comprising at least one of Phosphorus, Arsenic and Antimony.

21. The method of claim 14, wherein at least one of the plurality of ion implantation steps using C ions is an implantation step in which the ions impinges the semiconductor structure at an angle less than 90-degrees with respect to the upper surface of the semiconductor structure.

22. The method of claim 14, wherein at least one of the plurality of ion implantation steps using C ions is an implantation step in which the ions are oriented along crystallographic planes of the semiconductor structure to enhance deep placement of C ions in the semiconductor structure.

\* \* \* \* \*